US012640701B2

(12) United States Patent
Hasanovic et al.

(10) Patent No.: US 12,640,701 B2
(45) Date of Patent: May 26, 2026

(54) SYSTEMS AND METHODS FOR FREQUENCY EQUALIZATION AND TEMPERATURE COMPENSATION IN RADIO FREQUENCY DEVICES

(71) Applicant: Smiths Interconnect Americas, Inc., Kansas City, MO (US)

(72) Inventors: Moamer Hasanovic, Palm City, FL (US); Conrad William Jordan, Stuart, FL (US)

(73) Assignee: Smiths Interconnect Americas, Inc., Kansas City, MO (US)

( * ) Notice: Subject to any disclaimer, the term of this patent is extended or adjusted under 35 U.S.C. 154(b) by 97 days.

(21) Appl. No.: 18/813,736

(22) Filed: Aug. 23, 2024

(65) Prior Publication Data

US 2025/0062737 A1 Feb. 20, 2025

Related U.S. Application Data

(63) Continuation of application No. 18/488,009, filed on Oct. 16, 2023, now abandoned, which is a
(Continued)

(51) Int. Cl.
*H03H 7/38* (2006.01)
*H03H 7/54* (2006.01)

(52) U.S. Cl.
CPC ............. *H03H 7/383* (2013.01); *H03H 7/54* (2013.01)

(58) Field of Classification Search
CPC .......... H03H 7/383; H03H 7/54; H03H 7/251; H03H 7/0123; H03H 7/48; H04B 3/14; H04B 3/144
(Continued)

(56) References Cited

U.S. PATENT DOCUMENTS 3,569,869 A 3/1971 Sutton, Jr. et al.
4,135,132 A 1/1979 Tafjord
(Continued)

FOREIGN PATENT DOCUMENTS

CN 1285653 A 2/2001
CN 1725632 A 1/2006
(Continued)

OTHER PUBLICATIONS

European Extended Search Report, Application No. 20888868.5, dated Mar. 19, 2024, 6 pps.
(Continued)

*Primary Examiner* — Jorge L Salazar, Jr.
(74) *Attorney, Agent, or Firm* — Armstrong Teasdale LLP

(57) ABSTRACT

A frequency equalizer is provided. The frequency equalizer includes a coupler including a main segment extending between a first port and a second port and a coupled segment disposed in a coupling relationship with the main segment and extending between a third port and a fourth port. The frequency equalizer further includes a first thermistor electrically coupled in series between the first port and an input line, a second thermistor electrically coupled in series between the second port and an output line, and a first shunt resistor coupled across the third port. The frequency equalizer simultaneously provides frequency equalization and temperature compensation for signals transmitted through the frequency equalizer.

20 Claims, 5 Drawing Sheets

Related U.S. Application Data continuation of application No. 17/777,560, filed as application No. PCT/US2020/060842 on Nov. 17, 2020, now abandoned.

(60) Provisional application No. 62/936,720, filed on Nov. 18, 2019.

(58) Field of Classification Search
USPC ... 333/33, 81 A, 81 R, 28 R, 172, 22 R, 216
See application file for complete search history.

(56) References Cited

U.S. PATENT DOCUMENTS

| | | | |
|---|---|---|---|
| 5,235,295 | A | 8/1993 | Barbaste et al. |
| 7,855,615 | B1 | 12/2010 | Karr |
| 2005/0153656 | A1 | 7/2005 | Hauger |
| 2006/0232356 | A1 | 10/2006 | Roldan et al. |
| 2006/0232357 | A1 | 10/2006 | Roldan et al. |

FOREIGN PATENT DOCUMENTS

| | | |
|---|---|---|
| CN | 201048378 Y | 4/2008 |
| CN | 103887586 A | 6/2014 |
| JP | H10190301 A | 7/1998 |
| JP | 2000196395 A | 7/2000 |

OTHER PUBLICATIONS

Slamnik, Nina et al., "Frequency Dependence of NTC Thermistor Pastes Used in High Frequency Temperature Variable Attenuators." 2018 48th European Microwave Conference (EuMC). IEEE, Sep. 23, 2018 (Sep. 23, 2018) [online] <https://ieeexplore.ieee.org/abstract/document/8541398> DOI: <10.23919/EuMC.2018.8541398>.

SYSTEMS AND METHODS FOR FREQUENCY EQUALIZATION AND TEMPERATURE COMPENSATION IN RADIO FREQUENCY DEVICES

CROSS REFERENCE TO RELATED APPLICATIONS

This application is a continuation of and claims the benefit of priority to U.S. patent application Ser. No. 18/488,009, filed Oct. 16, 2023, which claims priority to U.S. patent application Ser. No. 17/777,560, filed May 17, 2022, which is a National Stage entry of PCT/US2020/060842, filed Nov. 17, 2020, which claims priority to U.S. Provisional Patent Application No. 62/936,720 filed on Nov. 18, 2019, the disclosures of which is hereby incorporated by reference herein in their entireties as part of the present application.

BACKGROUND

The embodiments described herein relate generally to radio frequency (RF) interconnects, and more particularly, to frequency equalization and temperature compensation in RF devices.

RF devices are used for many applications, such as remote communication and sensing. The performance of such devices, for example, the ability of such devices to produce a desired output signal for a given input signal, may be affected by many different factors, such as a frequency of the input signal and a temperature of the RF device. For example, attenuation of RF signals generally increases as the frequency of the RF signal is increased. Further, as temperature increases, the attenuation of the RF signal generally increases correspondingly. Because RF devices are generally required to perform relatively consistently over a specified frequency range and/or temperature range, these interactions may be undesirable. However, the addition of compensation circuitry may increase costs of parts, manufacturing, and installation of the RF device, and once installed, may take up additional physical space within the RF application. A circuit that provides improved frequency equalization and temperature compensation is therefore desirable.

BRIEF SUMMARY

In one aspect, a frequency equalizer is provided. The frequency equalizer includes a coupler including a main segment extending between a first port and a second port and a coupled segment disposed in a coupling relationship with the main segment and extending between a third port and a fourth port. The frequency equalizer further includes a first thermistor electrically coupled in series between the first port and an input line, a second thermistor electrically coupled in series between the second port and an output line, and a first shunt resistor coupled across the third port. The frequency equalizer simultaneously provides frequency equalization and temperature compensation for signals transmitted through the frequency equalizer.

In another aspect, an electronics package for a frequency equalizer is provided. The electronics package includes a substrate having a first surface and a second surface, a ground plane disposed on the second surface, and a coupler including a main segment defined by a main strip disposed on the first surface and by the ground plane. The main segment extends between a first port and a second port. The coupler further includes a coupled segment defined by a coupled strip disposed on the second surface and by the ground plane. The coupled segment is disposed in a coupling relationship with the main segment and extends between a third port and a fourth port. The electronics package further includes a first thermistor disposed on the first surface and electrically coupled in series between the first port and an input line, a second thermistor disposed on the first surface and electrically coupled in series between the second port and an output line, and a first shunt resistor disposed on the first surface and electrically coupled across the third port. The electronics package simultaneously provides frequency equalization and temperature compensation for signals transmitted through the electronics package.

In another aspect, a method of manufacturing a frequency equalizer is provided. The method includes forming a coupler including a main segment extending between a first port and a second port and a coupled segment disposed in a coupling relationship with the main segment and extending between a third port and a fourth port, electrically coupling a first thermistor in series between the first port and an input line, electrically coupling a second thermistor in series between the second port and an output line, and electrically coupling a first shunt resistor across the third port. The frequency equalizer simultaneously provides frequency equalization and temperature compensation for signals transmitted through the frequency equalizer.

BRIEF DESCRIPTION OF THE DRAWINGS

FIG. 1 is a schematic diagram of an exemplary frequency equalizer;

FIG. 2 is a plan view of an exemplary electronics package that may be an implementation of the frequency equalizer shown in FIG. 1;

FIG. 3 is a plan view of another exemplary electronics package that may be an implementation of the frequency equalizer shown in FIG. 1;

FIG. 4 is a plan view of another exemplary electronics package that may be an implementation of the frequency equalizer shown in FIG. 1; and FIG. 5 is a flowchart of an exemplary method of manufacturing a frequency equalizer as shown in FIG. 1.

DETAILED DESCRIPTION

Figure 1:
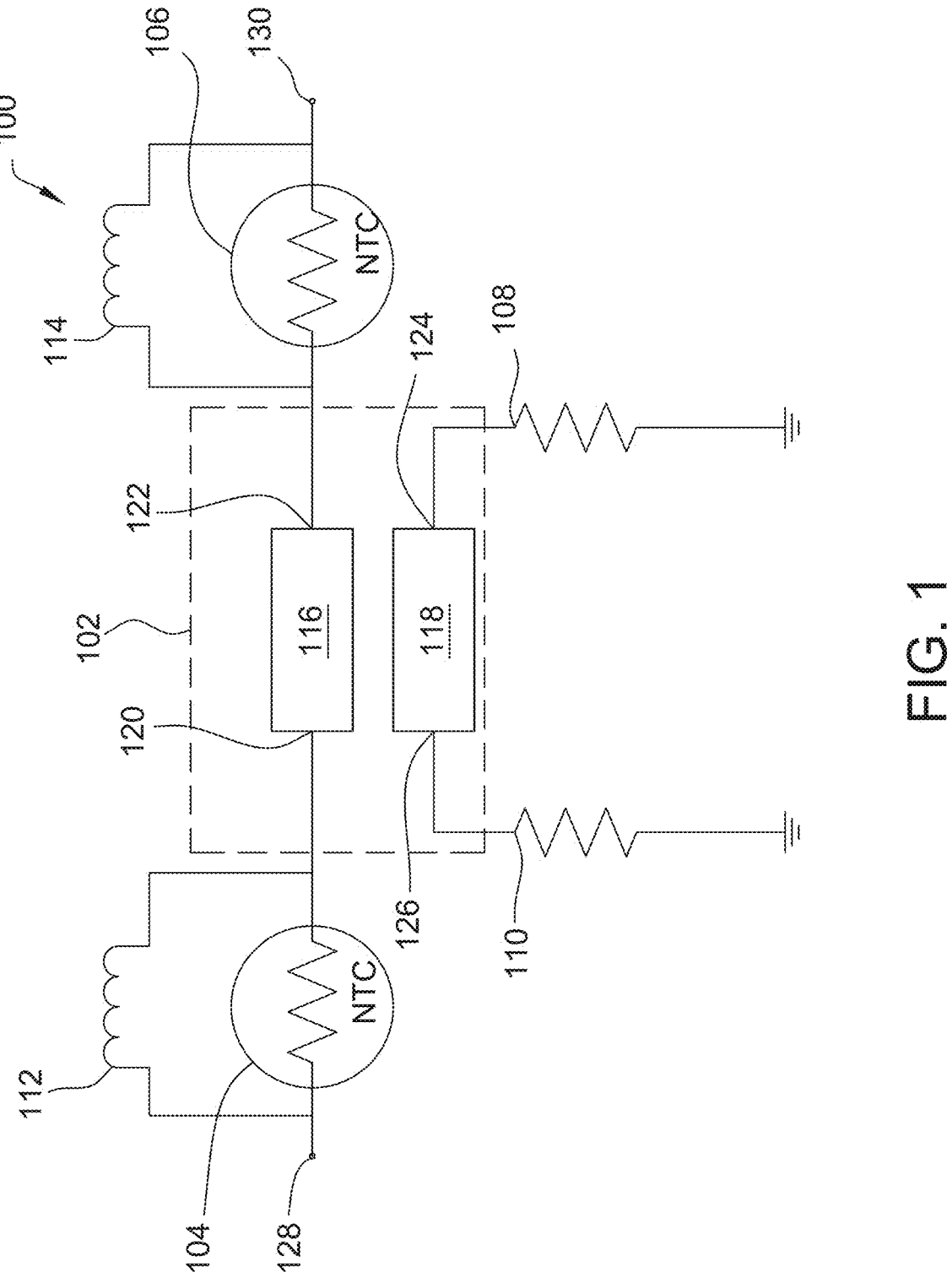
FIGS. 1-5 show exemplary embodiments of the systems and methods described herein.

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations are combined and interchanged, such ranges are identified and include all the sub-ranges contained therein unless context or language indicates otherwise.

The systems and methods described herein facilitate combined frequency equalization and temperature compensation for radio frequency (RF) applications using a single frequency equalizer circuit. The frequency equalizer circuit utilizes a combination of couplers and thermistors to perform both frequency equalization and temperature compensation. Accordingly, the frequency equalizer, as described herein, enables improved frequency equalization and temperature compensation in an RF application, and reduces the amount of material and physical space needed to perform frequency equalization and temperature compensation.

The subject matter described herein includes a frequency equalizer. The frequency equalizer includes a coupler that includes a main segment extending between a first port and a second port and a coupled segment disposed in a coupling relationship with the main segment and extending between a third port and a fourth port. The frequency equalizer further includes a first thermistor electrically coupled in series between the first port and an input line; a second thermistor electrically coupled in series between the second port and an output line, and a first shunt resistor coupled across the third port. The frequency equalizer simultaneously provides frequency equalization and temperature compensation for signals transmitted through the frequency equalizer.

In some implementations, the frequency equalizer further includes a second shunt resistor coupled across the fourth port.

In some implementations, the main segment and the coupled segment have different widths.

In some implementations, the coupler further includes a second coupled segment disposed in a second coupling relationship with the main segment and extending between a fifth port and a sixth port, and the frequency equalizer further includes a third shunt resistor and electrically coupled across the fifth port and a fourth shunt resistor and electrically coupled across the sixth port.

In some implementations, the coupler further includes a shunt line extending between the main segment and the coupled segment.

In some implementations, a length of the main segment is greater than a quarter wavelength of an input signal for the frequency equalizer.

In some implementations, the frequency equalizer further includes a first inductor electrically coupled in parallel with the first thermistor and a second inductor electrically coupled in parallel with the second thermistor.

In some implementations, at least one of the first thermistor and the second thermistor includes a thermistor paste.

In some implementations, the frequency equalizer further includes at least one impedance tuning structure electrically coupled across at least one of the input line, the output line, the first port, and the second port.

Referring now to FIG. 1, a frequency equalizer 100 is shown. Frequency equalizer 100 includes a coupler 102, a first thermistor 104, a second thermistor 106, a first shunt resistor 108, a second shunt resistor 110, a first inductor 112, and a second inductor 114.

Coupler 102 includes a main segment 116 and a coupled segment 118. Main segment 116 is a transmission line segment extending between a first port 120 and a second port 122. Coupled segment 118 is a transmission line segment extending between a third port 124 and a fourth port 126. In some embodiments, main segment 116 and coupled segment 118 are implemented as microstrip, stripline, and/or another type of RF transmission line. Third port 124 is terminated with first shunt resistor 108, and fourth port 126 is terminated with second shunt resistor 110. In some embodiments, first shunt resistor 108 and second shunt resistor 110 have a resistance selected to be a matched impedance load for coupled segment 118. For example, in some embodiments, first shunt resistor 108 and second shunt resistor 110 each have a resistance of 50 ohms.

Coupled segment 118 is disposed in a coupling relationship with main segment 116. When RF power is received at first port 120, power is transmitted via second port 122 and fourth port 126. The amount of power transmitted at one of second port 122 and fourth port 126 depends on the frequency of the RF power received at first port 120. For example, when the input signal has a frequency (sometimes referred to herein as a "center frequency") that corresponds to main segment 116 being one quarter wavelength, a maximum amount of RF power may be transferred to coupled segment 118 and transmitted via fourth port 126, and a minimum amount of power may be transmitted via second port 122. As the frequency of the input signal is increased above the center frequency, the amount of RF power transmitted via second port 122 increases. Accordingly, if coupler 102 is operated in a range greater than the center frequency, coupler 102 acts as an attenuator where the attenuation is inversely proportional to input frequency, and coupled segment 118 compensates for the tendency of RF signals to experience greater attenuation at increasingly higher frequencies.

In some embodiments, main segment 116 and coupled segment 118 have certain transmission line characteristics (e.g., characteristic impedance, electrical length, distance between transmission lines, etc.) selected to achieve a particular relationship between frequency and attenuation. For example, in some embodiments, main segment 116 and coupled segment 118 are microstrip lines each having a different width and/or shape that is selected to achieve a particular coupling relationship.

First thermistor 104 is electrically coupled between first port 120 of coupler 102 and an input 128, and second thermistor 106 is electrically coupled between second port 122 of coupler 102 and an output 130. In some embodiments, input 128 and output 130 are, for example, an input transmission line and an output transmission line, wherein frequency equalizer 100 receives an input signal at input 128 and transmits an output signal at output 130. First thermistor 104 and second thermistor 106 have a resistance that changes in response to a change in temperature of respective first thermistor 104 or second thermistor 106. For example, in some embodiments, first thermistor 104 and second thermistor 106 are negative temperature coefficient (NTC) thermistors that have a resistance that decreases as temperature increases. Accordingly, the attenuation of the input signal by first thermistor 104 and second thermistor 106 decreases as temperature increases, such that frequency equalizer 100 compensates for the tendency of RF signals to experience greater attenuation at increasing temperatures.

First inductor 112 is electrically coupled in parallel with first thermistor 104, and second inductor 114 is electrically coupled in parallel with second thermistor 106. First inductor 112 and second inductor 114 have each have an inductance that, at a predetermined operating frequency, tunes out a parasitic capacitance at first thermistor 104 and second thermistor 106, respectively.

Figure 2:
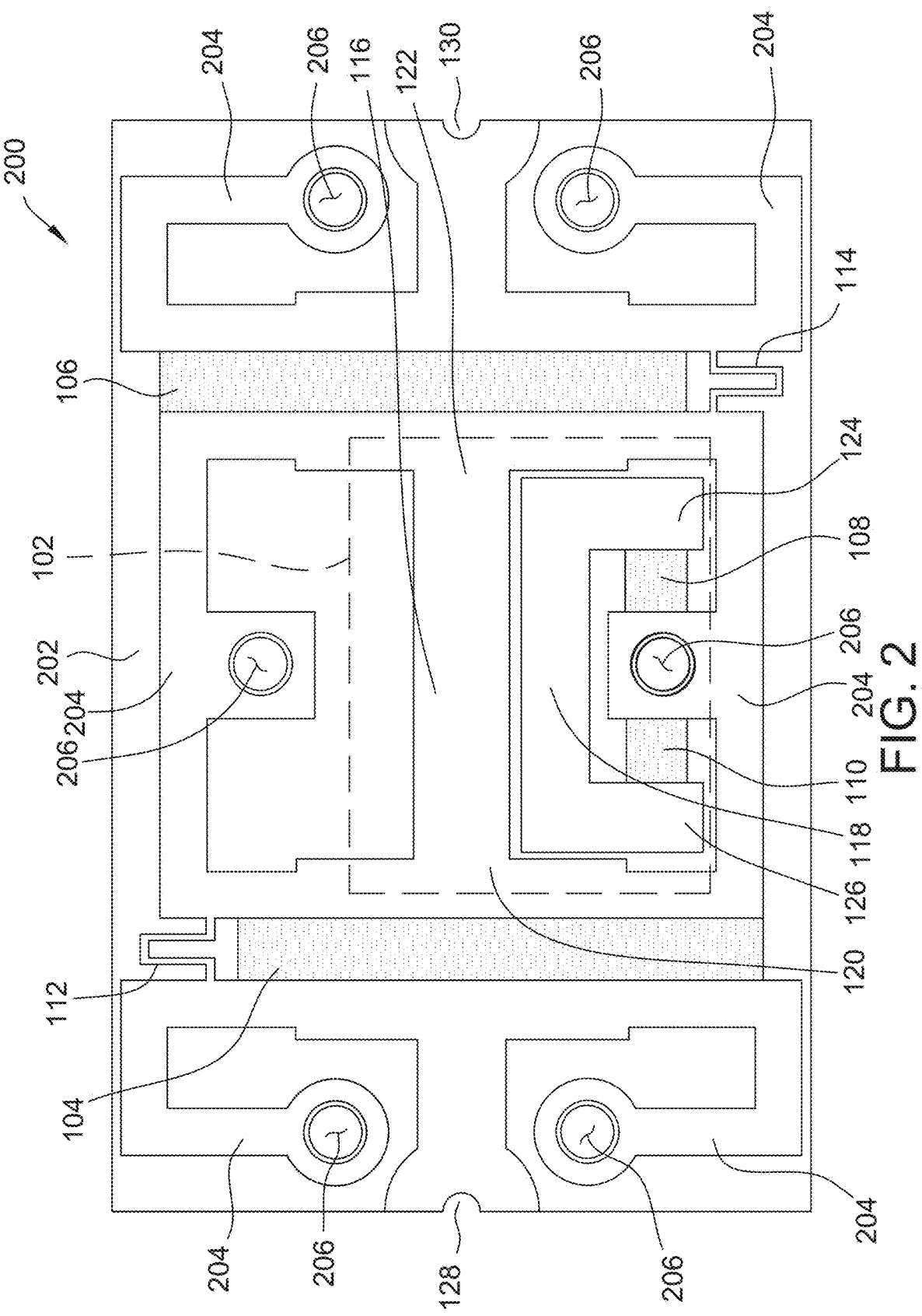

FIG. 2 is a plan view of an exemplary electronics package 200. Electronics package 200 is an exemplary implementation of frequency equalizer 100 (shown in FIG. 1). Electronics package 200 includes a substrate 202. Electronics package 200 further includes coupler 102, first thermistor 104, second thermistor 106, first shunt resistor 108, second shunt resistor 110, first inductor 112, and second inductor 114, which are implemented as microstrip disposed on a front side of substrate 202 and generally function as described with respect to FIG. 1. Electronics package 200 additionally includes impedance tuning structures 204, which are also implemented as microstrip disposed on the front side of substrate 202. Electronics package 200 further includes a ground plane (not shown) disposed on a reverse side of substrate 202.

Electronics package 200 includes conductive traces (e.g., microstrip) that, together with the ground plane, define, for example, main segment 116, coupled segment 118, first thermistor 104, second thermistor 106, first shunt resistor 108, second shunt resistor 110, first inductor 112, and second inductor 114. In some embodiments, at least one of first thermistor 104, second thermistor 106, first shunt resistor 108, and second shunt resistor 110 include a paste (e.g., a thermistor paste) disposed on substrate 202. Additionally or alternatively, in some embodiments, at least one of first thermistor 104, second thermistor 106, first shunt resistor 108, and second shunt resistor 110 include other types of resistive components (e.g., surface mount technology (SMT) components).

Impedance tuning structures 204 are coupled across input 128, output 130, first port 120, and second port 122. Impedance tuning structures 204 include microstrip disposed on the front surface of substrate 202 and a through hole 206 extending between and forming an electrical connection between the microstrip and the ground plane disposed on the back surface of substrate 202. In some embodiments, impedance tuning structures 204 have, for example, a length that is selected to tune out a parasitic capacitance in electronics package 200 at the predetermined operating frequency.

Figure 3:
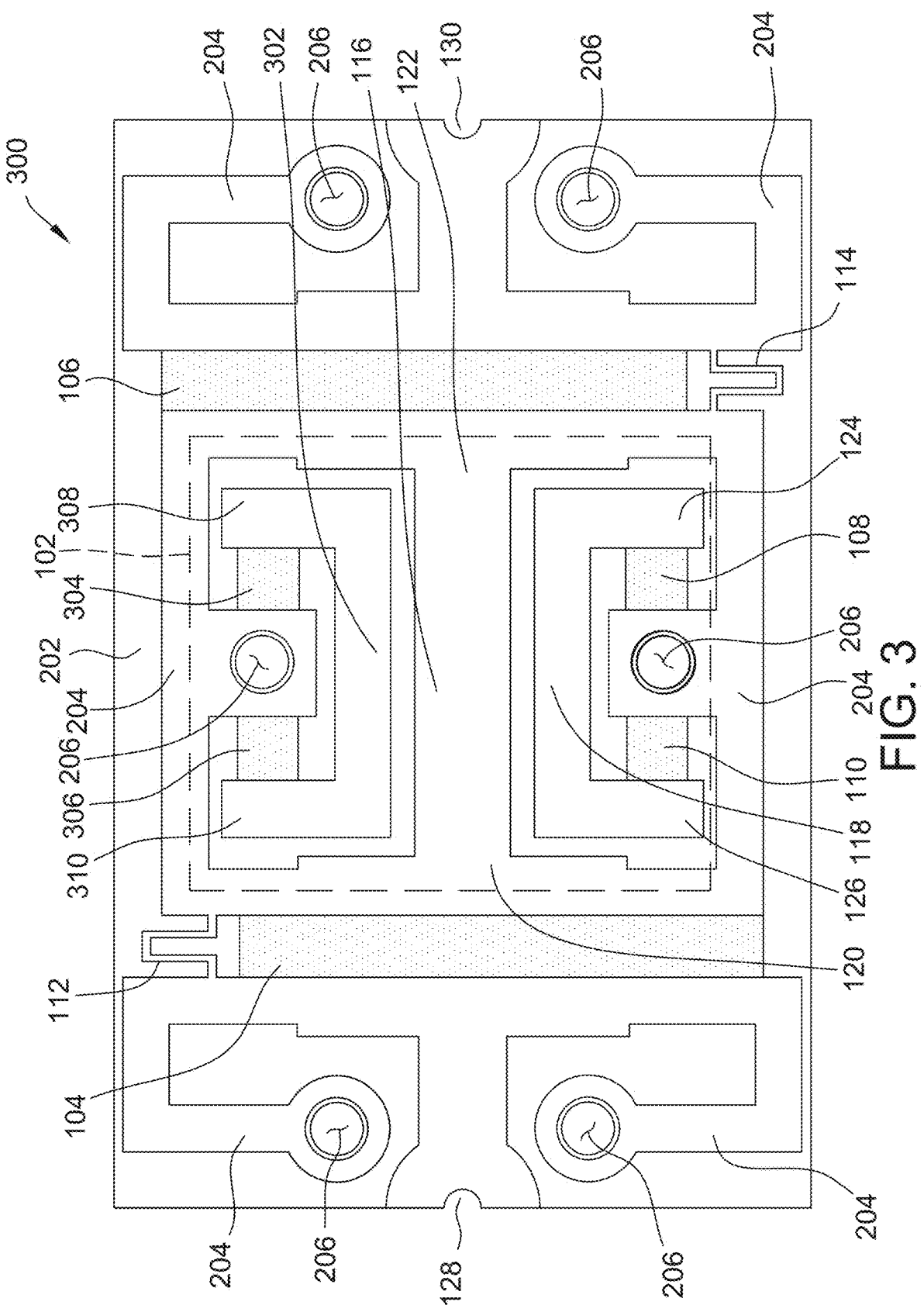

FIG. 3 is a plan view of another exemplary electronics package 300. Electronics package 300 is another exemplary implementation of frequency equalizer 100 (shown in FIG. 1). Electronics package 300 includes coupler 102, first thermistor 104, second thermistor 106, first shunt resistor 108, second shunt resistor 110, first inductor 112, second inductor 114, substrate 202, impedance tuning structures 204, and through holes 206, which generally operate as described with respect to FIGS. 1 and 2. Electronics package 300 further includes a second coupled segment 302, a third shunt resistor 304, and a fourth shunt resistor 306.

Second coupled segment 302 extends between a fifth port 308 and a sixth port 310. Fifth port 308 is terminated with third shunt resistor 304, and sixth port 310 is terminated with fourth shunt resistor 306. Third shunt resistor 304 and fourth shunt resistor 306 are matched impedance loads for second coupled segment 302. For example, in some embodiments, third shunt resistor 304 and fourth shunt resistor 306 each have a resistance of 50 ohms.

Second coupled segment 302 is disposed in a coupling relationship with main segment 116. Second coupled segment 302 generally functions as described with respect to coupled segment 118 (shown in FIG. 1), and, together with coupled segment 118, serves to compensate for the tendency of RF signals to experience greater attenuation at increasingly higher frequencies. Second coupled segment 302 further increases coupling (e.g., a transfer of RF power away from main segment 116). Accordingly, electronics package 300 has an enhanced ability to achieve a particular desired relationship between frequency and attenuation.

Figure 4:
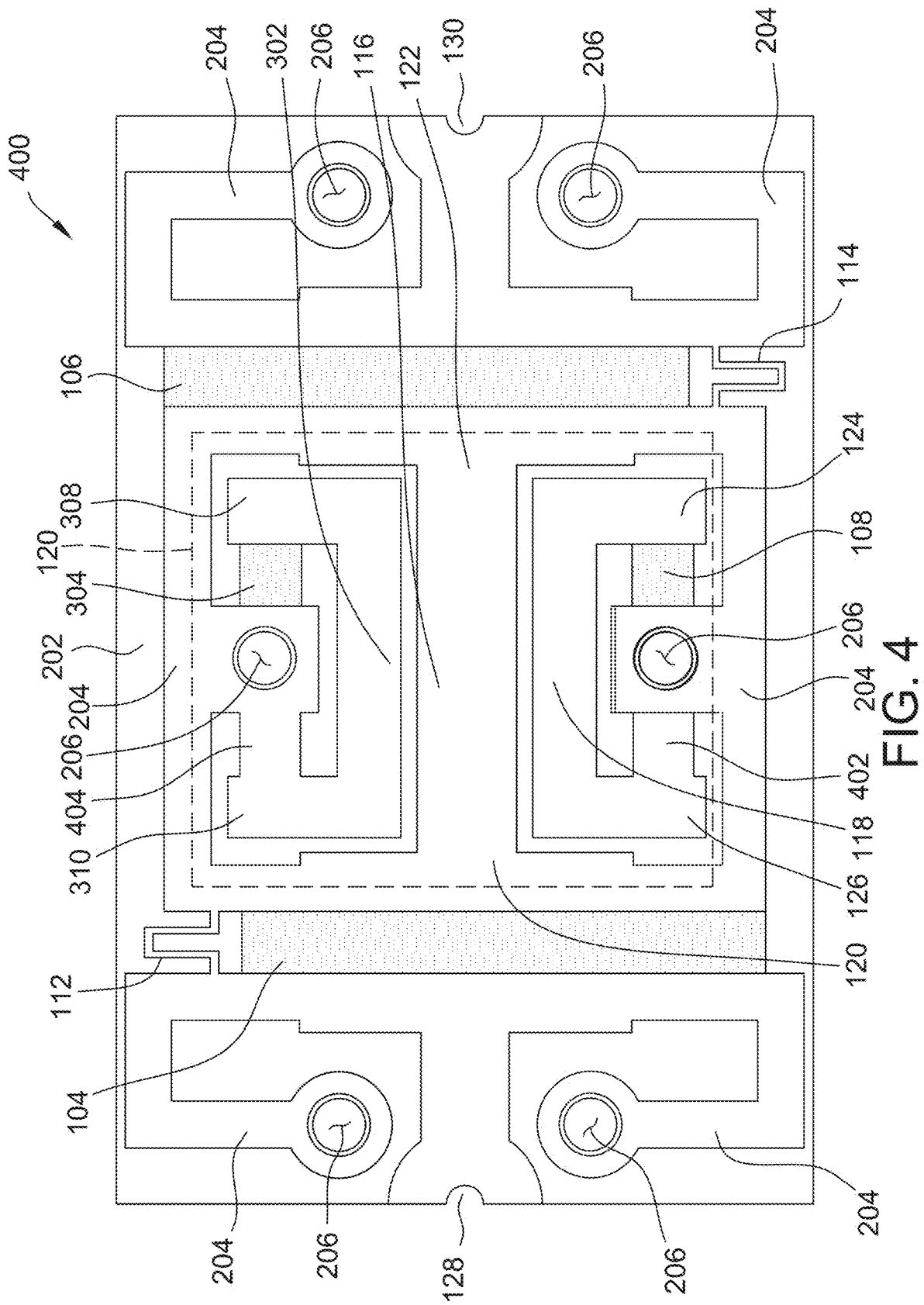

FIG. 4 is a plan view of another exemplary electronics package 400. Electronics package 400 is another exemplary implementation of frequency equalizer 100 (shown in FIG.

1). Electronics package 400 includes coupler 102, first thermistor 104, second thermistor 106, first shunt resistor 108, first inductor 112, second inductor 114, substrate 202, impedance tuning structures 204, through holes 206, second coupled segment 302, and third shunt resistor 304, which generally operate as described with respect to FIGS. 1-3. FIG. 4 further includes a first shunt line 402 and a second shunt line 404.

First shunt line 402 is a microstrip line extending between first port 120 and fourth port 126, and second shunt line 404 is a microstrip line extending between first port 120 and sixth port 310. First shunt line 402 and second shunt line 404 further increase coupling (e.g., a transfer of RF power away from main segment 116). Accordingly, electronics package 400 has an enhanced ability to achieve a particular desired relationship between frequency and attenuation.

Figure 5:
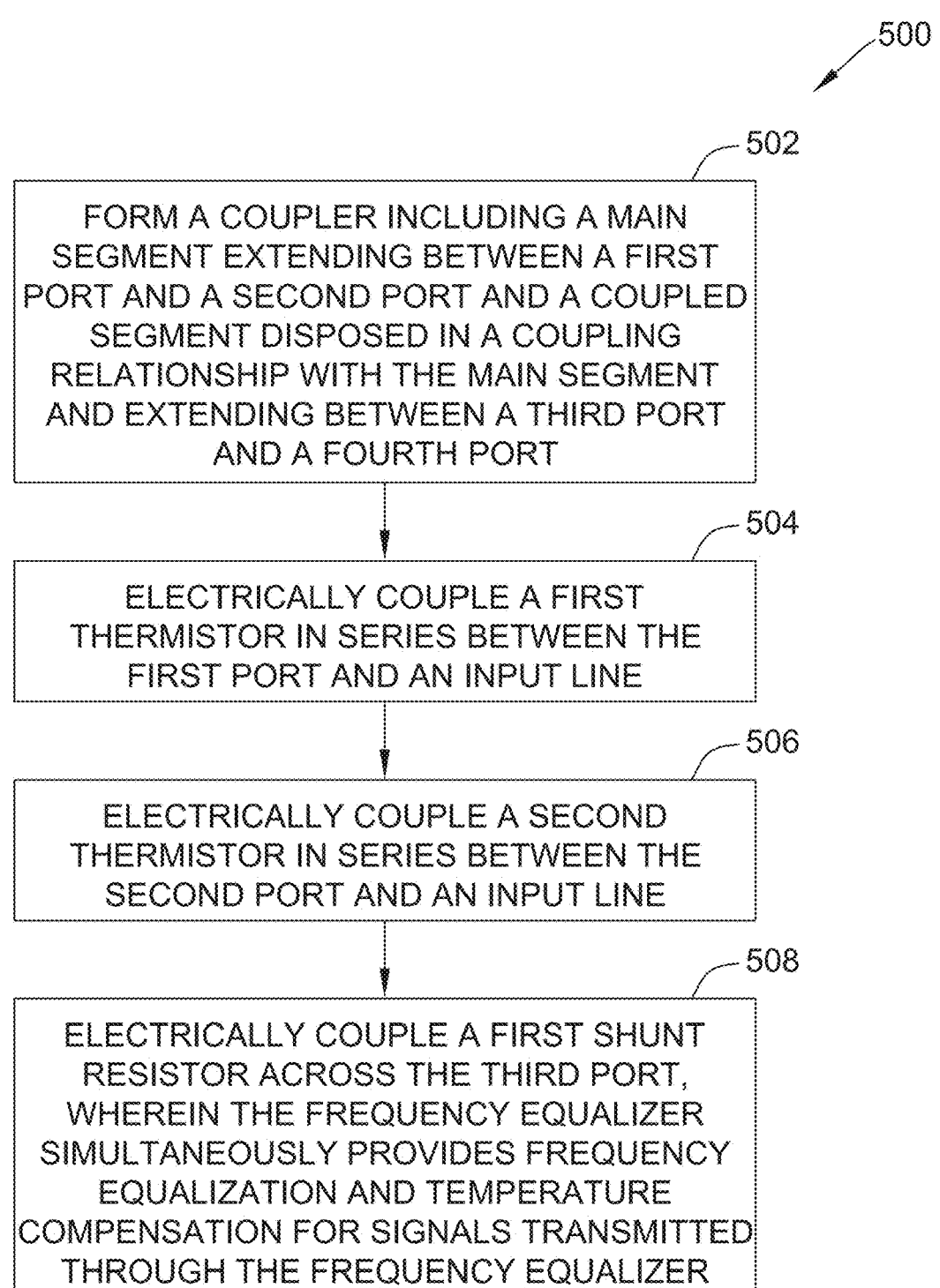

FIG. 5 is an exemplary method 500 for manufacturing frequency equalizer 100 (shown in FIG. 1). In the exemplary embodiment, method 500 includes forming 502 a coupler (e.g., coupler 102) including a main segment (e.g., main segment 116) extending between a first port (e.g., first port 120) and a second port (e.g., second port 122) and a coupled segment (e.g., coupled segment 118) disposed in a coupling relationship with the main segment and extending between a third port (e.g., third port 124) and a fourth port (e.g., fourth port 126). Method 500 further includes electrically coupling 504 a first thermistor (e.g., first thermistor 104) in series between the first port and an input line. Method 500 further includes electrically coupling 506 a second thermistor (e.g., second thermistor 106) in series between the second port and an output line. Method 500 further includes electrically coupling 508 a first shunt resistor (e.g., first shunt resistor 108) across the third port, wherein frequency equalizer 100 simultaneously provides frequency equalization and temperature compensation for signals transmitted through frequency equalizer 100.

Exemplary embodiments of methods and systems are described above in detail. The methods and systems are not limited to the specific embodiments described herein, but rather, components of systems and/or steps of the methods may be used independently and separately from other components and/or steps described herein. Accordingly, the exemplary embodiment can be implemented and used in connection with many other applications not specifically described herein.

Technical effects of the systems and methods described herein include at least one of (a) providing frequency equalization for attenuation in an RF device using a coupler having a length greater than one quarter wavelength of the input signal; (b) providing temperature compensation for attenuation in an RF device using one or more thermistors; and (c) reducing an amount of physical space of a frequency equalization and temperature compensation circuit by integrating frequency equalization and temperature compensation into a single electronics package.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose various embodiments, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A frequency equalizer comprising:
   a coupler comprising:
      a main segment extending between a first port and a second port; and
      a coupled segment disposed in a coupling relationship with said main segment and extending between a third port and a fourth port;
   a first thermistor electrically coupled in series between the first port and an input line;
   a second thermistor electrically coupled in series between the second port and an output line; and
   a first shunt resistor coupled to the third port, wherein said frequency equalizer simultaneously provides frequency equalization and temperature compensation for signals transmitted through said frequency equalizer.

2. The frequency equalizer of claim 1, further comprising a second shunt resistor coupled to the fourth port.

3. The frequency equalizer of claim 1, wherein said main segment and said coupled segment have different widths.

4. The frequency equalizer of claim 1, wherein said coupler further comprises a second coupled segment disposed in a second coupling relationship with the main segment and extending between a fifth port and a sixth port, and wherein said frequency equalizer further comprises:
   a third shunt resistor and electrically coupled to the fifth port; and
   a fourth shunt resistor and electrically coupled to the sixth port.

5. The frequency equalizer of claim 1, wherein said coupler further comprises a shunt line extending between said main segment and said coupled segment.

6. The frequency equalizer of claim 1, wherein a length of the main segment is greater than a quarter wavelength of an input signal for said frequency equalizer.

7. The frequency equalizer of claim 1, further comprising a first inductor electrically coupled in parallel with said first thermistor and a second inductor electrically coupled in parallel with said second thermistor.

8. The frequency equalizer of claim 1, wherein at least one of said first thermistor and said second thermistor comprises a thermistor paste.

9. The frequency equalizer of claim 1, further comprising at least one impedance tuning structure electrically coupled to at least one of the input line, the output line, the first port, and the second port.

10. An electronics package for a frequency equalizer comprising:
   a substrate having a first surface and a second surface;
   a ground plane disposed on the second surface;
   a coupler comprising:
      a main segment defined by a main strip disposed on the first surface and by said ground plane, said main segment extending between a first port and a second port; and
      a coupled segment defined by a coupled strip disposed on the second surface and by said ground plane, said coupled segment disposed in a coupling relationship with said main segment and extending between a third port and a fourth port;
   a first thermistor disposed on the first surface and electrically coupled in series between the first port and an input line;
   a second thermistor disposed on the first surface and electrically coupled in series between the second port and an output line; and
   a first shunt resistor disposed on the first surface and electrically coupled to the third port, wherein said electronics package simultaneously provides frequency equalization and temperature compensation for signals transmitted through said electronics package.

11. The electronics package of claim 10, further comprising a second shunt resistor disposed on the first surface and electrically coupled to the fourth port.

12. The electronics package of claim 10, wherein said main strip and said coupled strip have different widths.

13. The electronics package of claim 10, wherein said coupler further comprises a second coupled segment defined by a second coupled strip disposed on the first surface and by said ground plane, said second coupled segment disposed in a second coupling relationship with the main segment and extending between a fifth port and a sixth port, and wherein the frequency equalizer further comprises:
   a third shunt resistor disposed on the first surface and electrically coupled to the fifth port; and
   a fourth shunt resistor disposed on the first surface and electrically coupled to the sixth port.

14. The electronics package of claim 10, wherein said coupler further comprises a shunt line extending between said main segment and said coupled segment.

15. The electronics package of claim 10, wherein a length of the main segment is greater than a quarter wavelength for an input signal of the frequency equalizer.

16. The electronics package of claim 10, further comprising a first inductor electrically coupled in parallel with said first thermistor and a second inductor electrically coupled in parallel with said second thermistor.

17. The electronics package of claim 10, wherein at least one of said first thermistor and said second thermistor comprise a thermistor paste disposed on the first surface.

18. The electronics package of claim 10, further comprising at least one impedance tuning structure electrically coupled to at least one of the input line or the output line.

19. A method of manufacturing a frequency equalizer, said method comprising:
   forming a coupler including a main segment extending between a first port and a second port and a coupled segment disposed in a coupling relationship with the main segment and extending between a third port and a fourth port;
   electrically coupling a first thermistor in series between the first port and an input line;
   electrically coupling a second thermistor in series between the second port and an output line; and
   electrically coupling a first shunt resistor to the third port, wherein the frequency equalizer simultaneously provides frequency equalization and temperature compensation for signals transmitted through the frequency equalizer.

20. The method of claim 19, further comprising electrically coupling a second shunt resistor to the fourth port.

* * * * *